(12) United States Patent
Lu

(10) Patent No.: US 7,969,221 B2
(45) Date of Patent: Jun. 28, 2011

(54) ELECTRONIC DEVICE AND SQUARE WAVE GENERATOR THEREOF

(75) Inventor: Jian-Hui Lu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 0 days.

(21) Appl. No.: 12/612,664

(22) Filed: Nov. 4, 2009

(65) Prior Publication Data
US 2010/0109736 A1  May 6, 2010

(30) Foreign Application Priority Data

Nov. 6, 2008  (CN) .......................... 2008 1 0305407

(51) Int. Cl.
*H03K 3/00* (2006.01)
(52) U.S. Cl. .................... 327/291; 327/172; 327/299
(58) Field of Classification Search .......... 327/172–175, 327/178, 291–292, 298–299
See application file for complete search history.

(56) References Cited

U.S. PATENT DOCUMENTS

| 4,071,776 | A | * | 1/1978 | Isham, II | 327/140 |
| 4,131,807 | A | * | 12/1978 | Korver | 327/136 |
| 4,319,204 | A | | 3/1982 | Weldon et al. | |
| 4,347,560 | A | | 8/1982 | Seiersen | |
| 4,600,295 | A | * | 7/1986 | Suzuki | 399/56 |
| 4,746,842 | A | | 5/1988 | Ponte et al. | |
| 5,045,800 | A | * | 9/1991 | Kung | 327/176 |

* cited by examiner

*Primary Examiner* — An T Luu
(74) *Attorney, Agent, or Firm* — Frank R. Niranjan

(57) ABSTRACT

A square wave generator includes a sawtooth wave generator for generating a sawtooth wave, and a convertor for generating a square wave based on the sawtooth wave. The sawtooth wave generator includes a capacitor and a switching unit connected parallel to each other. A first terminal of the capacitor is electrically coupled to a power source and the convertor, and a second terminal of the capacitor is grounded. The switching unit includes a trigger and a field-effect transistor. When a voltage of the first terminal of the capacitor is not less than a first threshold voltage of the trigger, the trigger is turned on to activate the field-effect transistor, the field-effect transistor is turned on to ground the first terminal of the capacitor, so that the capacitor discharges rapidly.

20 Claims, 3 Drawing Sheets

ELECTRONIC DEVICE AND SQUARE WAVE GENERATOR THEREOF

BACKGROUND

1. Technical Field

The present disclosure generally relates to waveform generators, and particularly to a square wave generator of an electronic device.

2. Description of Related Art

A square wave in electronics is a kind of non-sinusoidal waveform. An ideal square wave alternates regularly and instantaneously between two levels. Because the fast transitions of the square wave are suitable for triggering synchronous logic circuits at precisely determined intervals, it is widely used as a timing reference or a clock signal in signal processing. However, because of poor designs, traditional square wave generators often need to monitor many factors when generating square waves. Monitoring the factors will cause errors in the periodic repetition of the square waves. Thus, the periods of the square waves are not accurate.

Therefore, an improved electronic device including a square wave generator capable of generating a substantially ideal square waveform is needed in the industry to address the aforementioned deficiency.

BRIEF DESCRIPTION OF THE DRAWINGS

The components of the drawings are not necessarily drawn to scale, the emphasis instead being placed upon clearly illustrating the principles of the embodiments of the electronic device and the square wave generator. Moreover, in the drawings, like reference numerals designate corresponding parts throughout several views.

DETAILED DESCRIPTION

Figure 1:
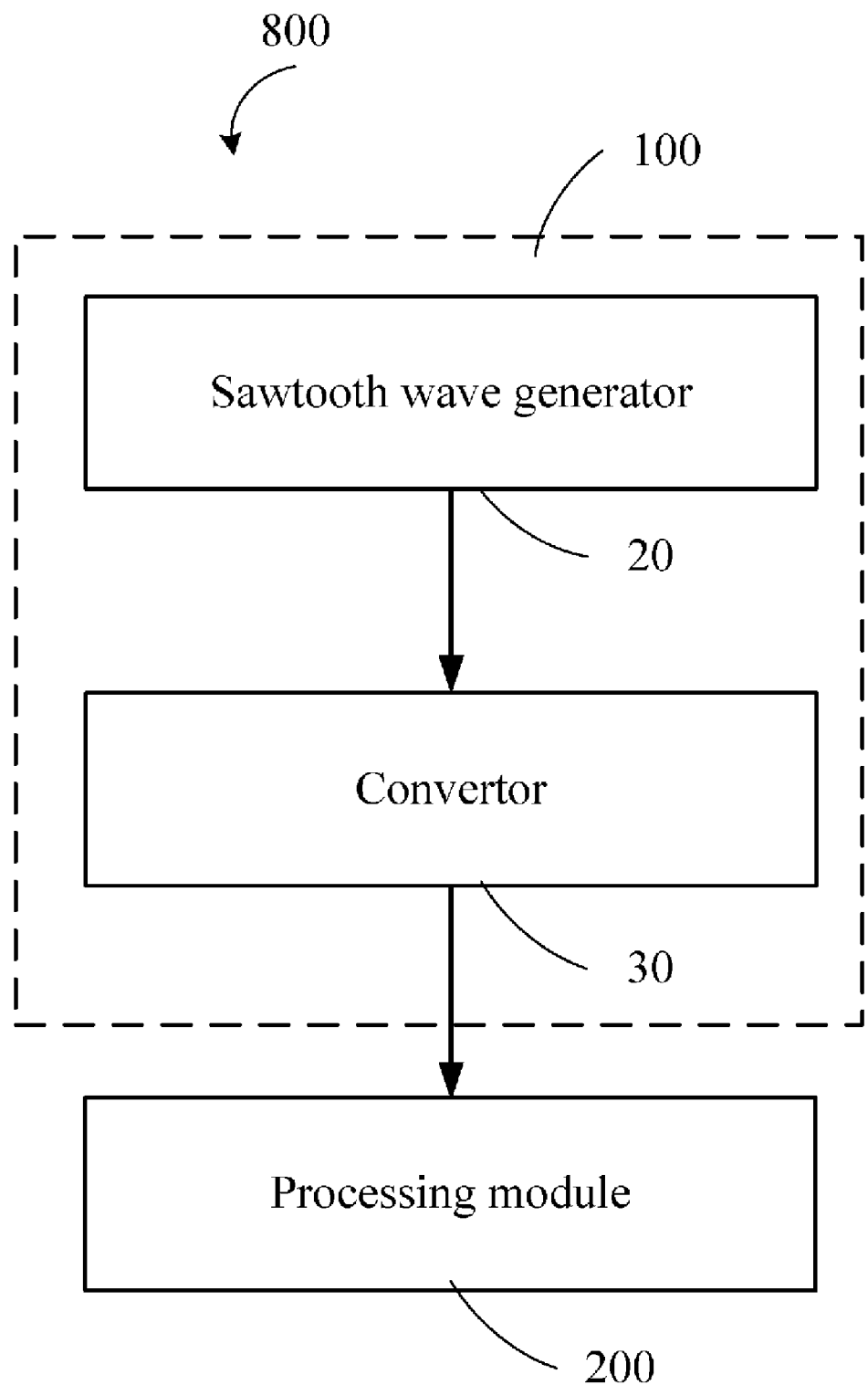
FIG. 1 is a block diagram showing an electronic device having a square wave generator in accordance with an exemplary embodiment.

Referring to FIG. 1, an electronic device 800 including a square wave generator 100 and a processing module 200 in accordance with an exemplary embodiment is illustrated. The electronic device 800 may be a computer, a mobile phone, a personal digital assistant (PDA), etc. The square wave generator 100 is capable of generating a substantially ideal square wave by comparing a sawtooth wave with a reference voltage. The processing module 200 operates based on the square wave. The square wave may be used as a clock signal by the processing module 200.

The square wave generator 100 includes a sawtooth wave generator 20 and a convertor 30. The sawtooth wave generator 20 is configured for generating a sawtooth wave. The convertor 30 is configured for generating the square wave based on the sawtooth wave.

Figure 2:
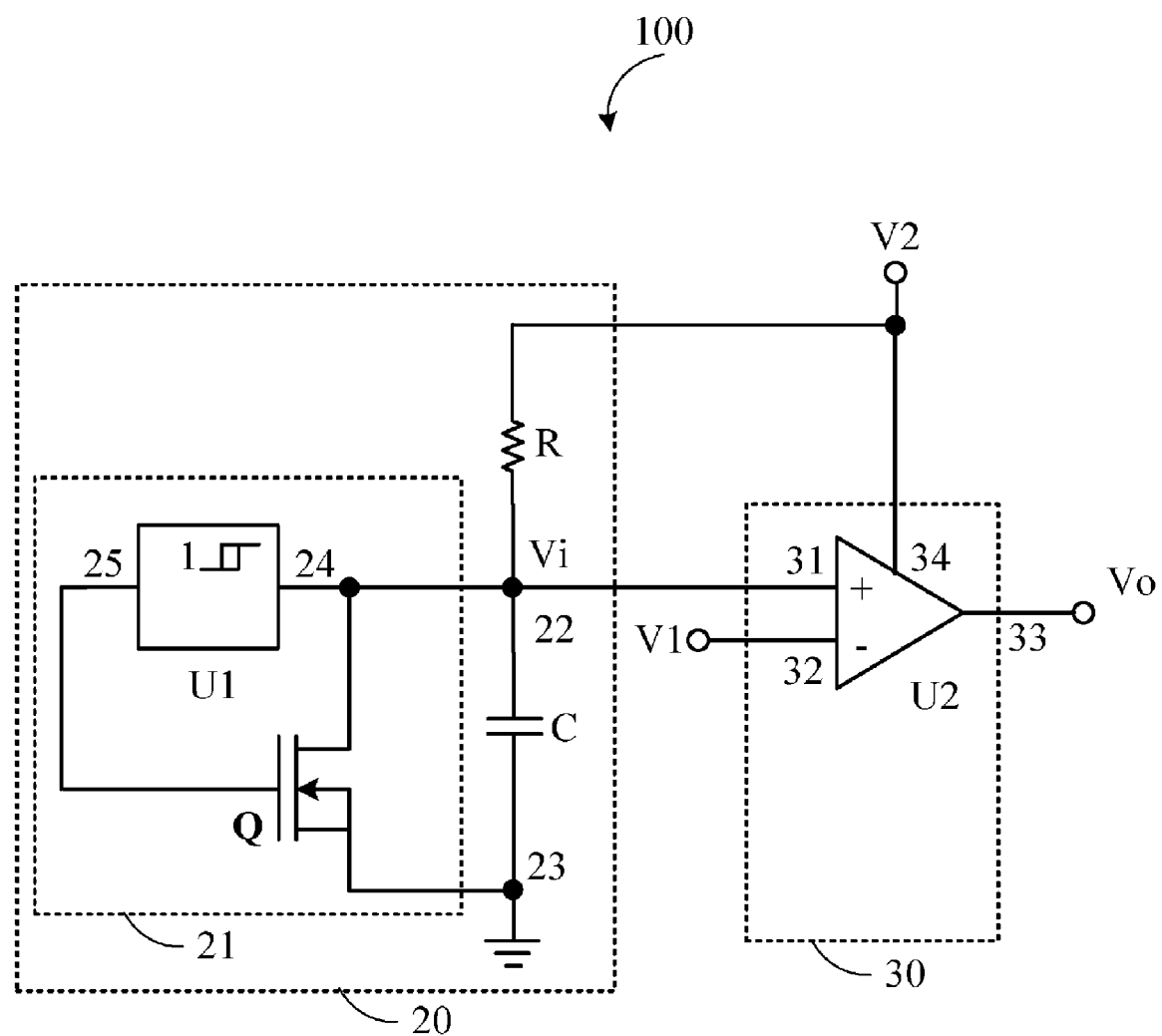
FIG. 2 is a circuit diagram showing the square wave generator of FIG. 1.

Referring to FIG. 2, the sawtooth wave generator 20 includes a resistor R, a capacitor C, and a switching unit 21. The capacitor C and the switching unit 21 are connected parallel to each other. A first terminal 22 of the capacitor C is electrically coupled to a direct current (DC) power source V2 and the convertor 30 via the resistor R. The power source V2 supplies a DC voltage that is also labeled as V2. A second terminal 23 of the capacitor C is grounded. When a voltage drop on the capacitor C equals to or is greater than a predetermined value, the switching unit 21 closes and grounds the first terminal 22 of the capacitor C, as a result, the capacitor C discharges rapidly.

In the embodiment, the switching unit 21 includes a trigger U1 and a field-effect transistor (FET) Q. The trigger U1 is a Schmitt trigger. The FET Q is an N-Channel depletion-mode insulated-gate transistor. The input terminal 24 of the trigger U1 is connected to the first terminal 22 of the capacitor C, and the output terminal 25 of the trigger U1 is connected to the gate of the FET Q. The source of the FET Q is grounded, and the drain of the FET Q is connected to the first terminal 22 of the capacitor C. In other embodiments, the FET Q may be a bipolar junction transistor (BJT).

The convertor 30 includes a comparator U2. The non-inverting input terminal 31 of the comparator U2 is connected to the first terminal 22 of the capacitor C. The inverting input terminal 32 of the comparator U2 is connected to a reference power supply V1. The power terminal 34 of the comparator U2 is connected to the power source V2. The output terminal 33 of the comparator U2 is connected to the processing module 200 of the electronic device 800.

The output of the comparator U2 is labeled as Vo. The reference power supply V1 supplies a reference voltage that is also labeled as V1 and lower than voltage V2. The trigger U1 is configured with a first threshold voltage V3 (see FIG. 3) and a second threshold voltage V4 (see FIG. 3). The first threshold voltage V3 is higher than the reference voltage V1 and lower than the voltage V2. The second threshold voltage V4 is higher than zero volts and lower than the reference voltage V1.

Figure 3:
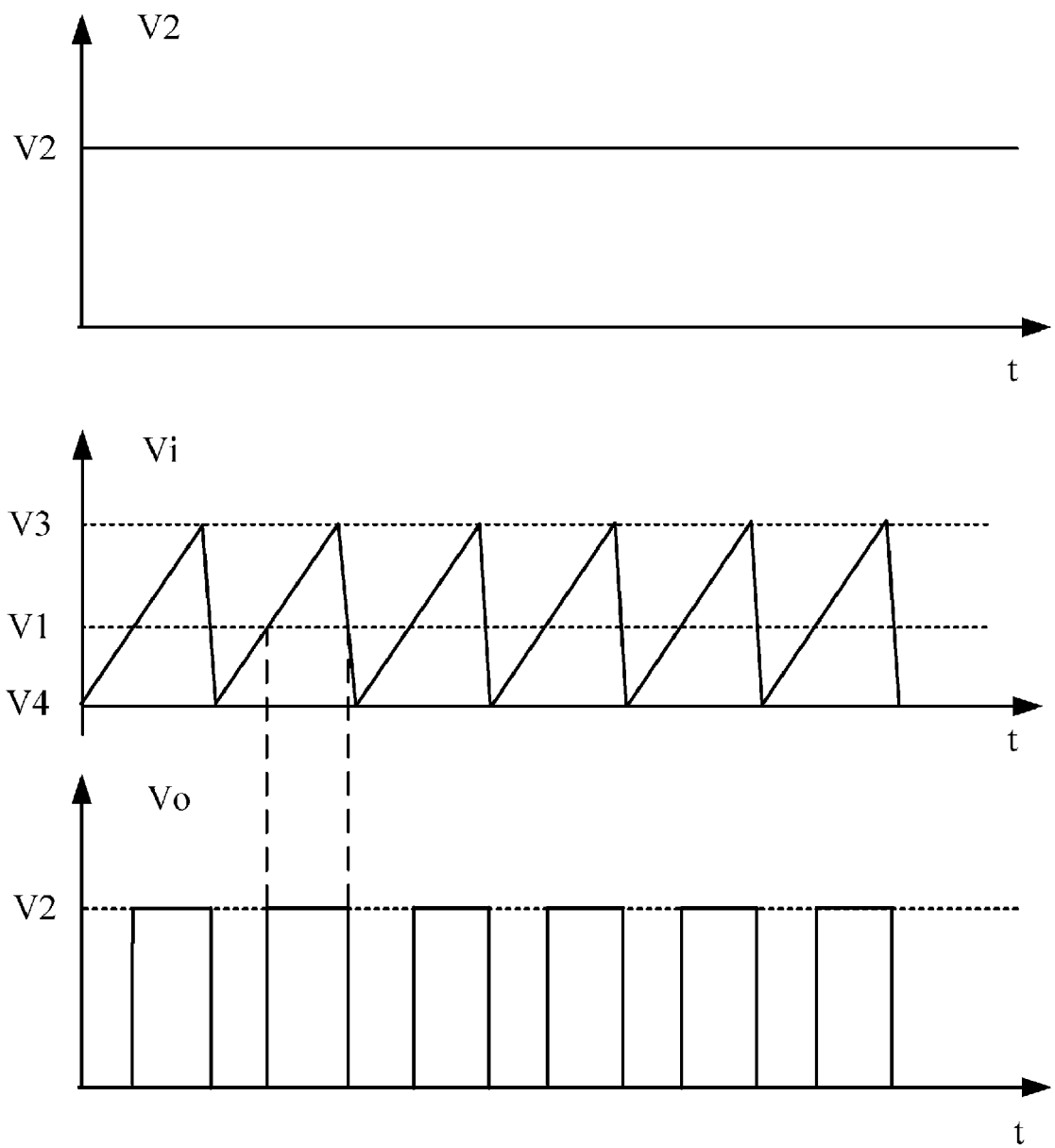
FIG. 3 is a graphical plot showing a direct current (DC) power supply, a sawtooth waveform and a square waveform generated by the square wave generator of FIG. 2.

Referring also to FIG. 3, in operation, when the electronic device 800 is powered on, the capacitor C is charged, and a voltage Vi on the capacitor C increases. When the voltage Vi rises above the reference voltage V1, the comparator U2 outputs a high voltage that substantially equals to V2 as the output Vo. When the voltage Vi equals to the first threshold voltage V3 of the trigger U1, the trigger U1 outputs a high voltage that turns on the FET Q. As a result, the first terminal 22 of the capacitor C becomes grounded, the capacitor C discharges quickly and the voltage Vi drops sharply. In theory, when the voltage Vi drops below V1, the comparator U2 outputs a low voltage, 0 volts for example as the output Vo. When the voltage Vi equals to the second threshold voltage V4, the trigger U1 outputs a low voltage that turns off the FET Q. As a result, the capacitor C becomes charged by the power source V2 again.

To sum up, the sawtooth wave generator 20 generates a sawtooth wave, and the convertor 30 monitors the sawtooth wave to generate the square wave. Because the sawtooth wave ramps upward to form a slope and then sharply drops, only the slope of the sawtooth wave needs to be monitored, thus the periods of the square wave is more accurate.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A square wave generator, comprising:
a sawtooth wave generator for generating a sawtooth wave, the sawtooth wave generator comprising a capacitor and a switching unit connected parallel to each other; and
a convertor for generating a square wave based on the sawtooth wave;
wherein a first terminal of the capacitor is electrically coupled to a power source and the convertor, and a second terminal of the capacitor is grounded, the switching unit comprises a trigger and a field-effect transistor, an input terminal of the trigger is connected to the first terminal of the capacitor, and an output terminal of the trigger is connected to the gate of the field-effect transistor, the source of the field-effect transistor is grounded, and the drain of the field-effect transistor is connected to the first terminal of the capacitor, when a voltage of the first terminal of the capacitor is not less than a first threshold voltage of the trigger, the trigger is turned on to activate the field-effect transistor, the field-effect transistor is turned on to ground the first terminal of the capacitor, so that the capacitor discharges rapidly.

2. The square wave generator of claim 1, wherein when the capacitor is charged by the power source, the voltage of the first terminal of the capacitor is accumulated, when the voltage of the first terminal is not less than the first threshold of the trigger, the trigger is turned on to activate the field-effect transistor, when the field-effect transistor is turned on by the trigger, the capacitor is rapidly discharged and is recharged by the power source.

3. The square wave generator of claim 1, wherein the trigger is a Schmitt trigger.

4. The square wave generator of claim 3, wherein the field-effect transistor is an N-Channel depletion-mode insulated-gate transistor.

5. The square wave generator of claim 1, wherein the convertor comprises a comparator comprising an non-inverting input terminal connected to the first terminal of the capacitor, the comparator further comprises an inverting input terminal receiving a reference voltage, a power terminal connected to the power source, and an output terminal for outputting the square wave.

6. The square wave generator of claim 5, wherein the power source supplies a direct current voltage greater than the reference voltage.

7. The square wave generator of claim 6, wherein the trigger is configured with the first threshold voltage and a second threshold voltage, the first threshold voltage is higher than the reference voltage and is lower than the direct current voltage supplied from the power source, the second threshold voltage is lower than the reference voltage.

8. An electronic device having a square wave generator, the electronic device comprising:
a sawtooth wave generator for generating a sawtooth wave, the sawtooth wave generator comprising a capacitor and a switching unit connected parallel to each other;
a convertor for generating a square wave based on the sawtooth wave; and
a processing module operating based on the square wave;
wherein a first terminal of the capacitor is electrically coupled to a power source and the convertor, and a second terminal of the capacitor is grounded, the switching unit comprises a trigger and a field-effect transistor, an input terminal of the trigger is connected to the first terminal of the capacitor, and an output terminal of the trigger is connected to the gate of the field-effect transistor, the source of the field-effect transistor is grounded, and the drain of the field-effect transistor is connected to the first terminal of the capacitor, when a voltage drop of the first terminal of the capacitor is not less than a first threshold of the trigger, the trigger is turned on to activate the field-effect transistor, the field-effect transistor is turned on to ground the first terminal of the capacitor, so that the capacitor discharges rapidly, and a low voltage level of the square wave is outputted to the processing module.

9. The electronic device of claim 8, wherein when the capacitor is charged by the power source, the voltage of the first terminal of the capacitor is accumulated, when the voltage of the first terminal is not less than the first threshold of the trigger, the trigger is turned on to activate the field-effect transistor, when the field-effect transistor is turned on by the trigger, the capacitor is rapidly discharged and is recharged by the power source.

10. The electronic device of claim 8, wherein the trigger is a Schmitt trigger.

11. The electronic device of claim 10, wherein the field-effect transistor is an N-Channel depletion-mode insulated-gate transistor.

12. The electronic device of claim 8, wherein the convertor comprises a comparator comprising an non-inverting input terminal connected to the first terminal of the capacitor, the comparator further comprises an inverting input terminal receiving a reference voltage, a power terminal connected to the power source, and an output terminal for outputting the square wave to the processing module.

13. The electronic device of claim 8, wherein the power source supplies a direct current voltage greater than the reference voltage.

14. The electronic device of claim 13, wherein the trigger is configured with the first threshold and a second threshold, the first threshold is higher than the reference voltage and is lower than the direct current voltage supplied from the power source, the second threshold is lower than the reference voltage.

15. A square wave generator for generating a square wave having a high level and a low level, the square wave generator comprising:
a sawtooth wave generator for generating a sawtooth wave having a ramp period, the sawtooth wave generator comprising a capacitor and a switching unit connected parallel to each other; and
a convertor for generating a square wave based on the sawtooth wave;
wherein a first terminal of the capacitor is electrically coupled to a power source and the convertor, and a second terminal of the capacitor is grounded, the capacitor is charged by the power source, the switching unit comprises a trigger and a field-effect transistor, when the capacitor is charged by the power source, a voltage of the first terminal of the capacitor is accumulated, when the voltage of the first terminal is not less than a first threshold of the trigger, the trigger is turned on to activate the field-effect transistor, when the field-effect transistor is turned on by the trigger, the capacitor is rapidly discharged and is recharged by the power source.

16. The square wave generator of claim 15, wherein an input terminal of the trigger is connected to the first terminal of the capacitor, and an output terminal of the trigger is connected to the gate of the field-effect transistor, the source of the field-effect transistor is grounded, and the drain of the field-effect transistor is connected to the first terminal of the capacitor.

17. The square wave generator of claim 16, wherein the trigger is a Schmitt trigger, and the field-effect transistor is an N-Channel depletion-mode insulated-gate transistor.

18. The square wave generator of claim 16, wherein the convertor comprises a comparator comprising an non-inverting input terminal connected to the first terminal of the capacitor, the comparator further comprises an inverting input terminal receiving a reference voltage, a power terminal connected to the power source, and an output terminal for outputting the square wave.

19. The square wave generator of claim 18, wherein the power source supplies a direct current voltage greater than the reference voltage.

20. The square wave generator of claim 19, wherein the trigger is configured with the first threshold voltage and a second threshold voltage, the first threshold voltage is higher than the reference voltage and is lower than the direct current voltage supplied from the power source, the second threshold voltage is lower than the reference voltage.

* * * * *